United States Patent [19]
Weber

[11] Patent Number: 5,057,908
[45] Date of Patent: Oct. 15, 1991

[54] HIGH POWER SEMICONDUCTOR DEVICE WITH INTEGRAL HEAT SINK

[75] Inventor: Robert J. Weber, Boone, Iowa

[73] Assignee: Iowa State University Research Foundation, Inc., Ames, Iowa

[21] Appl. No.: 550,863

[22] Filed: Jul. 10, 1990

[51] Int. Cl.$^5$ .............................................. H01L 39/02
[52] U.S. Cl. ....................................... 357/81; 357/80; 357/74
[58] Field of Search ........................ 357/80, 82, 82, 74

[56] References Cited

U.S. PATENT DOCUMENTS

| | | | |
|---|---|---|---|
| 3,716,759 | 2/1973 | Scarce et al. | 357/81 |
| 4,517,584 | 5/1985 | Matsushita et al. | 357/81 |
| 4,742,024 | 5/1988 | Sugimoto et al. | 357/81 |
| 4,796,077 | 1/1989 | Takeda et al. | 357/81 |
| 4,803,546 | 2/1989 | Sugimoto et al. | 357/81 |
| 4,908,695 | 3/1990 | Morihara et al. | 357/82 |
| 4,926,242 | 5/1990 | Itoh et al. | 357/81 |
| 4,946,376 | 8/1990 | Sharma et al. | 357/82 |
| 4,987,478 | 1/1991 | Braun et al. | 357/81 |

OTHER PUBLICATIONS

Tuckerman and Pease "High Performance Heat Sinking for VLSI" IEEE Electron Device Letters, vol. EDL-2 No. 5 5.81 pp. 126–129.
"Thermal Management In Semiconductor Device Packaging", M. Mahalingam, Proceedings of the IEEE, vol. 73, No. 9, Sep. 1985, pp. 1396–1404.
"High-Performance Heat Sinking For VLSI", Tuckerman et al., IEEE Electron Device Letters, vol. EDL-2, No. 5, May 1981, pp. 126–129.
Article in IEEE Transactions Components, Hybrids, vol. CHMT-8, No. 2, Jun. 1985, p. 247.
"VLSI Packaging Technique Using Liquid-Cooled Channels", Kishimoto et al., IEEE Transactions on Components, Hybrids, vol. CHMT-9, No. 4, 12/87, pp. 328–335.
"Narrow Channel Forced Air Heat Sink", N. Goldberg, IEEE Transactions on Components, Hybrides, vol. CHMT-7, No. 1, Mar. 1984, pp. 154–159.
"Boiling Jet Impingement Cooling Of Simulated Microelectronic Chips", Ma et al., Dept. of Mechanical Engineering, Iowa State University, pp. 5–12.
"A1N Substrates with High Thermal Conductivity", Kurokawa et al., IEEE Transactions on Components, Hybrids, & Mfg. Technology, vol. CHMT-8, No. 2, Jun. 1985, pp. 247–252.

Primary Examiner—Andrew J. James
Assistant Examiner—T. Davenport
Attorney, Agent, or Firm—Leydig, Voit & Mayer

[57] ABSTRACT

A high power semiconductor device with integral heat sink capable of accommodating substantial heat flux on the order of one kw per cm$^2$. The integral heat sink is formed on the active surface of the semiconductor and utilizes an AlN thin film of high purity to provide a low thermal impedance heat conductor for removing heat directly from the active semiconductor surface. A microchannel heat sink is formed on the A1N thin film and has a source of cooling fluid flowing through the microchannel heat sink for conducting heat away from the sink. The result is the ability to conduct large heat fluxes away from the intimately contacted heat generating semiconductor surface to the cooling fluid in the microchannel heat sink and thus operate the semiconductor under substantially higher power than has been practical heretofore in a device of such simplicity.

8 Claims, 4 Drawing Sheets 5,057,908

HIGH POWER SEMICONDUCTOR DEVICE WITH INTEGRAL HEAT SINK

FIELD OF THE INVENTION

The present invention relates to semiconductor devices, and more particularly to high power device utilizing heat sink technology for dissipating the heat generated during high power operation.

BACKGROUND OF THE INVENTION

Integrated circuit technology is moving toward very dense large-scale integration which in turn can result in high power dissipation within a relatively small integrated circuit surface area. Particularly in the case of high frequency operation, it is desirable to keep interconnecting lead lengths very short, and the result compels high packing density of such circuits. In certain high power, high density circuits, power fluxes on the order of several hundred watts per square centimeter have been approached, and have taxed the capacity of heat sink technology to dissipate that heat and allow the associated semiconductor circuits to operate with a tolerable temperature rise. There is a need to increase the power flux handling capacity to the level of a kilowatt or more per square centimeter in some applications, and conventional techniques are limited in their ability to handle such high power densities.

Various forms of mechanical coolant systems have been devised in the past in an effort to remove heat from the heat-generating semiconductor source, and those systems have utilized both forced air and moving liquid. Among those techniques are microchannel cooling which utilizes an array of narrow channels either in the semiconductor substrate, or in a heat sink attached to the semiconductor substrate, and circulates cooling fluid through the microchannels for conducting heat away from the semiconductor device. While that approach has been found to be relatively efficient, it has heretofore been limited, using relatively conventional sources of cooling fluid, in its ability to operate at heat generating levels approaching 1000 watts per square centimeter while maintaining desirably low semiconductor junction temperatures. In short, the cooling efficiency is not as high as is desired to limit temperature to desired ranges in all forms of high power, high density integrated circuits.

SUMMARY OF THE INVENTION

In view of the foregoing, it is a general aim of the present invention to provide an integral heat sink for a semiconductor device which is more efficient than microchannel heat sinks which were utilized in the past.

In that regard, it is an object of the present invention to provide a heat sink which concurrently accomplishes the dual goals of 1) efficiently conducting heat directly away from the semiconductor heat generating elements to a mechanically cooled heat sink, and 2) efficiently transporting the heat in the active heat sink away from the heat-generating semiconductor device.

According to one aspect of the invention, it is an object to produce a highly efficient heat sink device for use with a high power semiconductor which is capable under the appropriate circumstances of operating in heat fluxes on the order of 1000 watts per square centimeter with a temperature rise which can be tolerated by available semiconductor devices.

Other objects and advantages will become apparent from the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
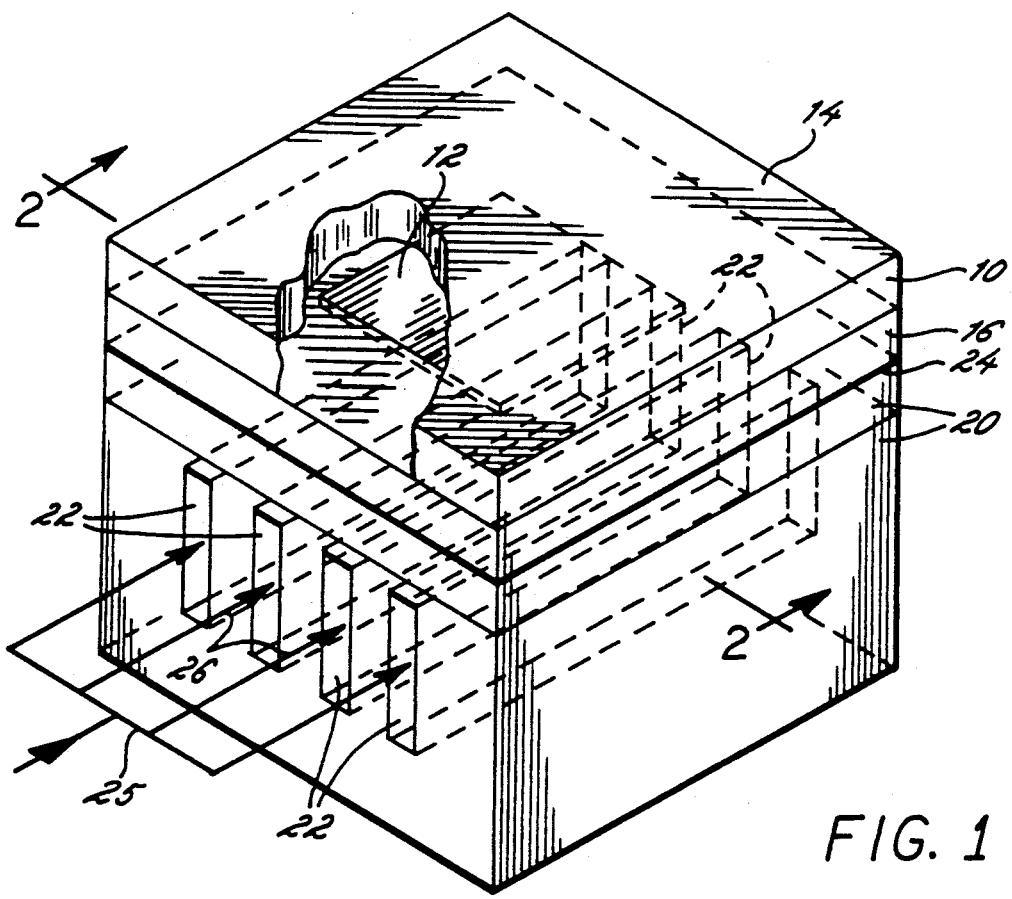
FIG. 1 is a diagram, partly in perspective, showing a high power semiconductor device with integral heat sink exemplifying the present invention.

Turning now to the drawings, FIG. 1 shows in diagrammatic fashion a high power semiconductor device incorporating an integral heat sink exemplifying the present invention. As is conventional, the device includes a semiconductor substrate which serves as a support, typically crystalline, carrying the semiconductor structure which performs the functions intended for the electronic device and also, in the process, dissipates energy in the form of heat. The semiconductor substrate 10, as noted above, is typically a crystalline material, and can be, for example, an elemental semiconductor such as silicon or a compound semiconductor as exemplified by the III-V compounds such as GaAs. The substrate has a first surface 12 on which the semiconductor device is formed and a second surface 14 opposite the semiconductor carrying surface. It is the surface 14 which is conventionally used in the prior art techniques for formation of a heat sink. The semiconductor surface, on the other hand, conventionally has doped layers formed by various processes such as epitaxial growth, diffusion, ion implantation and the like forming the electrical structure of the semiconductor device. For example, in a MESFET, the semiconductor layer will include an ion implanted layer forming a channel separated by more heavily implanted regions comprising source and drain, with metallization on the surface forming contacts to the drain and source region and additional metallization forming a gate structure. In other semiconductor devices, the surface also conventionally has epitaxially grown layers which are doped to form p-doped or n-doped regions as needed for the semiconductor functions being implemented. In any event, it will be appreciated by those skilled in the art that the semiconductor structure formed on the surface 12 of the substrate is typically substantially thinner than the substrate itself and comprises the very portion of the semiconductor device which conducts currents and therefore produces heat (such as due to $I^2R$ losses) which must be conducted away in order to maintain junction temperatures of the semiconductor devices within tolerable bounds. The term "tolerable bounds" can have different meanings in connection with different types of semiconductors, but can rise to on the order of 80° C. for some types of semiconductors. Operating semiconductors at temperatures which are much higher than 80° C. usually requires semiconductors which are specially fabricated for such high temperature operation.

It is noted that the semiconductor device includes additional components which are not illustrated in the drawing since they are not important to an understanding of the present invention. For example, it is necessary to make external connections to certain of the semiconductor electrodes, such as by wire bonded leads, and such peripheral structures are omitted as being unnecessary to an understanding of the invention.

It is also noted that only individual semiconductor devices were discussed above in connection with a general description of the elements formed on the surface 12 of the substrate 10. It will be appreciated by those skilled in this art that many, many such structures are usually very densely packed in very large-scale integrated circuits, and that such tightly packed high power circuits will present a typical application of the present invention, since high speed and high density typically suggest the presence of high heat fluxes generated during operation.

In practicing the invention, heat sink means are associated directly with the substrate surface 12 which carries the semiconductor elements for efficiently conducting the generated heat away from the semiconductor elements without the necessity for conducting the heat through the substrate 10. Furthermore, in practicing the invention, the heat conductor which is applied to the semiconductor elements does not substantially affect the electrical operating parameters of the semiconductor element while providing an extremely efficient low thermal resistance path for carrying heat away from the heat generating semiconductor elements. To that end, a thin film 16 of low thermal resistance, such as aluminum nitride (AlN), is directly applied to the semiconductor carrying surface 12 for carrying heat away from such elements. The thin film AlN layer 16 is preferably of very pure material. Impurities, such as $Al_2O_3$ in the grain boundaries, tend to destroy the heat conduction properties of the film, and therefore should be avoided. Preferably, the AlN thin film is deposited by sputtering in a high vacuum atmosphere which rids the environment of impurities, such as atmospheric oxygen, which would tend to contaminate the thin film during the growing operation. Preferably, the thin film is on the order of 10 microns in thickness, although other thicknesses can be used as desired when the application demands. If the cation impurity content is less than about 250 ppm and the oxygen content is less than about 0.3% by weight, then the thermal conductivity of the AlN thin film will be greater than 160° C./mK at room temperture, and a thermal conductivity of that level is considered exemplary of a material with low thermal resistance as that term is used herein.

Since the thin film AlN is a highly efficient conductor of heat, the heat generated at the semiconductor source will be rapidly conducted through the thin film if the temperature differential across the film is sufficient. In order to help maintain such temperature differential and to transport the generated heat away from the semiconductor device, a highly efficient heat sink is associated intimately with the AlN heat conductive thin film. To that end, and referring to FIG. 1, a microchannel heat sink 20 is formed directly on the AlN thin film 16. The microchannel heat sink has a plurality of relatively thin channels 22 disposed therein and positioned relatively closely to the surface 24 of the heat sink which is in contact with the AlN film. A source of coolant fluid 25 circulates through the channel 22 as suggested by arrows 26. The coolant 25 in traversing the channels 22 is in contact with the relatively large surface area of the channel walls and thus tends to absorb and carry away heat which is conducted to the heat sink 20. The heat sink 20 is preferably of a highly heat conductive metal such as copper, and thus the heat generated in the semiconductor device on the surface 12 is conducted rapidly through the AlN thin film and passed to the copper of the heat sink 20. In turn, the cooling fluid 25 passing through the channels 22 absorbs the heat and transports it away. Using a structure such as that as suggested in FIG. 1, it is possible to operate a semiconductor device having a 1000 watt per square centimeter heat generating capability, utilizing a coolant flow rate of about 10 cc/sec and maintaining a temperature rise at the semiconductor junction of less than only 100° C.

The microchannel heat sink 20 is preferably of plated metal which is highly heat conductive, such as copper. A thin interface layer can be provided if necessary between the AlN thin film and the copper heat sink, as will be described in greater detail below. The interface layer is preferably metallic and is deposited in such a way as to assure bonding between the copper material of the heat sink and the material of the AlN thin film to achieve a metallurgical like bond.

The copper heat sink is preferably formed by initially evaporating a thin layer of copper (or other conductive metal) onto the AlN surface and utilizing that thin layer (or the interface layer if it is present and conductive) to electrodeposit the remainder of the copper material. The channels in the copper substrate can be in the range of about 50 to 1000 microns in width and about the same range in height. The channels can be rectangular as illustrated in FIG. 1 or of other shapes such as the round or oval channels. The channel shape and dimensions are selected to achieve an adequate surface area for contact with the liquid coolant. The contact area is established to achieve adequate heat transfer between the copper heat sink and the flowing fluid which, in conjunction with the rate of fluid flow and the temperature of the coolant removes adequate heat to maintain the semiconductor junction temperature within the desired tolerable limits.

Figure 2:
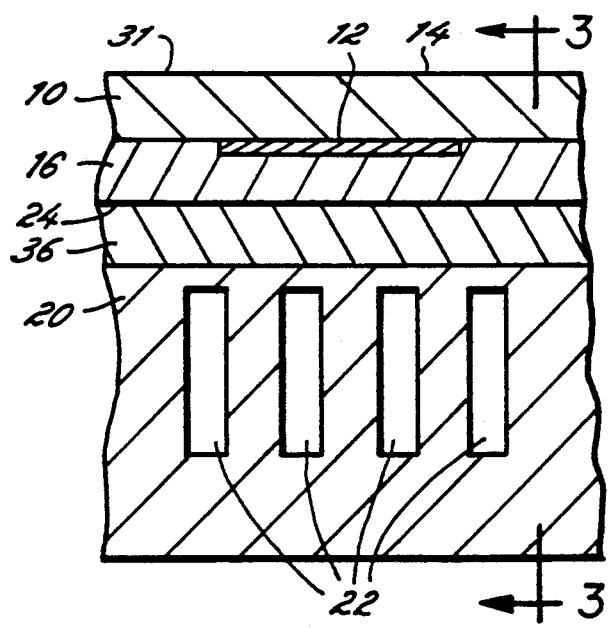
FIG. 2 is a front elevation taken along the line 2—2 of FIG. 1 further illustrating a heat sink according to the present invention.
Figure 3:
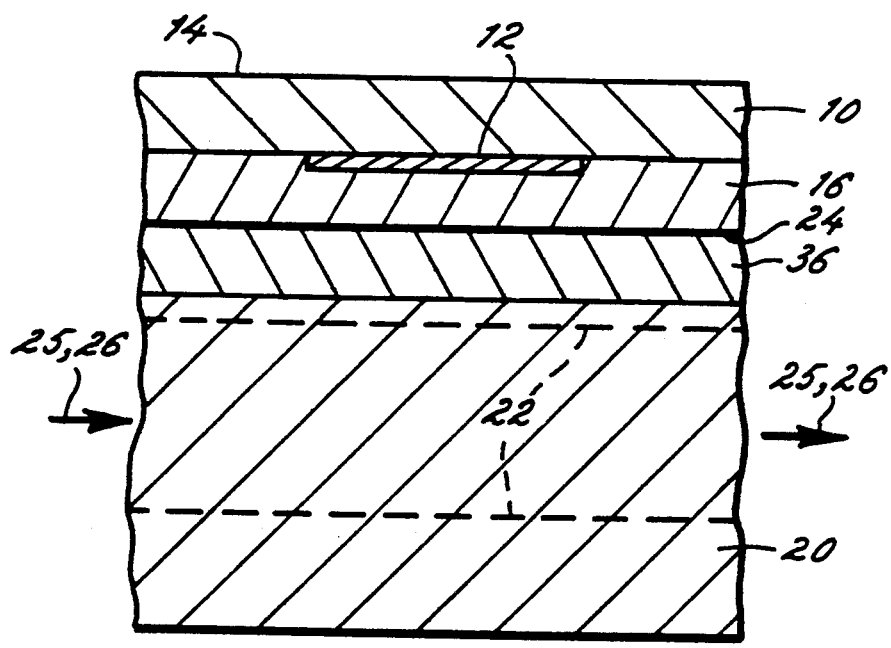
FIG. 3 is an end view of the heat sink taken along the lines 2—2 of FIG. 2.

The method of fabricating a semiconductor device to include an integral heat sink exemplifying the present invention will be described in connection with FIGS. 2 and 3. Those figures schematically show a semiconductor die 10 having a rear surface 14 and an active surface 12 which carries the semiconductor active layers as described in connection with FIG. 1. Deposited on active layer 12 is a heat conducting film such as AlN film 16 which is a sputtered thin film adapted to efficiently conduct heat away from the heat generating semiconductor devices on the surface 12. The thin film 16 is applied to the die by placing the die in a sputtering apparatus with a target of the desired material, and sputtering a thin film 16 onto the surface 12 for a time sufficient to produce a film of the desired thickness such as 10 microns. Following the sputtering of the AlN film, an interface film 24, if necessary, is applied over the AlN film. The interface film, which can be of titanium or tantalum is applied by conventional plating or evaporation techniques. Following that, a copper layer 36 is applied over the interface film also by conventional plating or evaporation techniques. The initial copper layer is several mils or less in thickness. After applying the initial copper layer, the remainder of the copper heat sink 20 is applied, preferably by electroplating.

In order to provide for microchannel cooling, means are provided for forming microchannels in the heat sink which is formed during the plating operation. For example, thin tubes are positioned in an array with respect to the first plated layer 36, then an encompassing copper layer 40 is electrodeposited to hold the thin tubes in place. Since it is desired to eliminate unnecessary interfaces, the tubes are then removed leaving a unitary copper heat sink 40 with microchannels 22 formed therein. The microchannels 22 as best shown in FIG. 3 are adapted to be connected to a source of fluid which is circulated very near the AlN surface to transport heat generated by the semiconductor away from that active device.

Numerous methods of forming the microchannels are available, as will be apparent to those skilled in this art. For example, thin tubes of metallic material are positioned following which electroplating of the copper heat sink 40 is accomplished. The metallic tubes are then removed as by selective etching. Alternatively, tubes of plastic material can be positioned to form the microchannels during electrodeposition. Following electrodeposition of the heat sink 40, the plastic tubes are removed as by etching, melting (if low temperature plastic material is used) or the like. In any event, the end result is a series of microchannels of the aforementioned dimensions through the copper heat sink 40 in the area of the die 30 such that heat generated in the semiconductor at surface 32 is efficiently conducted through the AlN thin film into the copper layer and thence transported away from the area by the coolant flow.

The nature of the AlN film is noteworthy in practice of the present invention. It was mentioned above that the AlN should be very pure and free of $Al_2O_3$ which might form in the grain boundaries and reduce the heat conduction properties of the thin film layer. In addition, it is known that AlN is nonconductive, i.e., it is a dielectric material, and thus is unlikely to interfere with the electrical functioning of the semiconductor device in most circumstances. In certain cases, the dielectric will introduce unwanted stray or parasitic capacitances, and the manner of dealing with such parasitic capacitances will be described in detail in connection with FIGS. 5 and 6. However, short of the parasitic capacitance problem, the AlN layer does not load the electrical circuit, although it is in intimate contact with that electrical circuitry and the metallization contacts, and thus leaves the electrical circuitry free to perform its electronic function, while the intimate contact between the AlN and that circuitry serves to conduct heat away from the circuitry.

Figure 4:
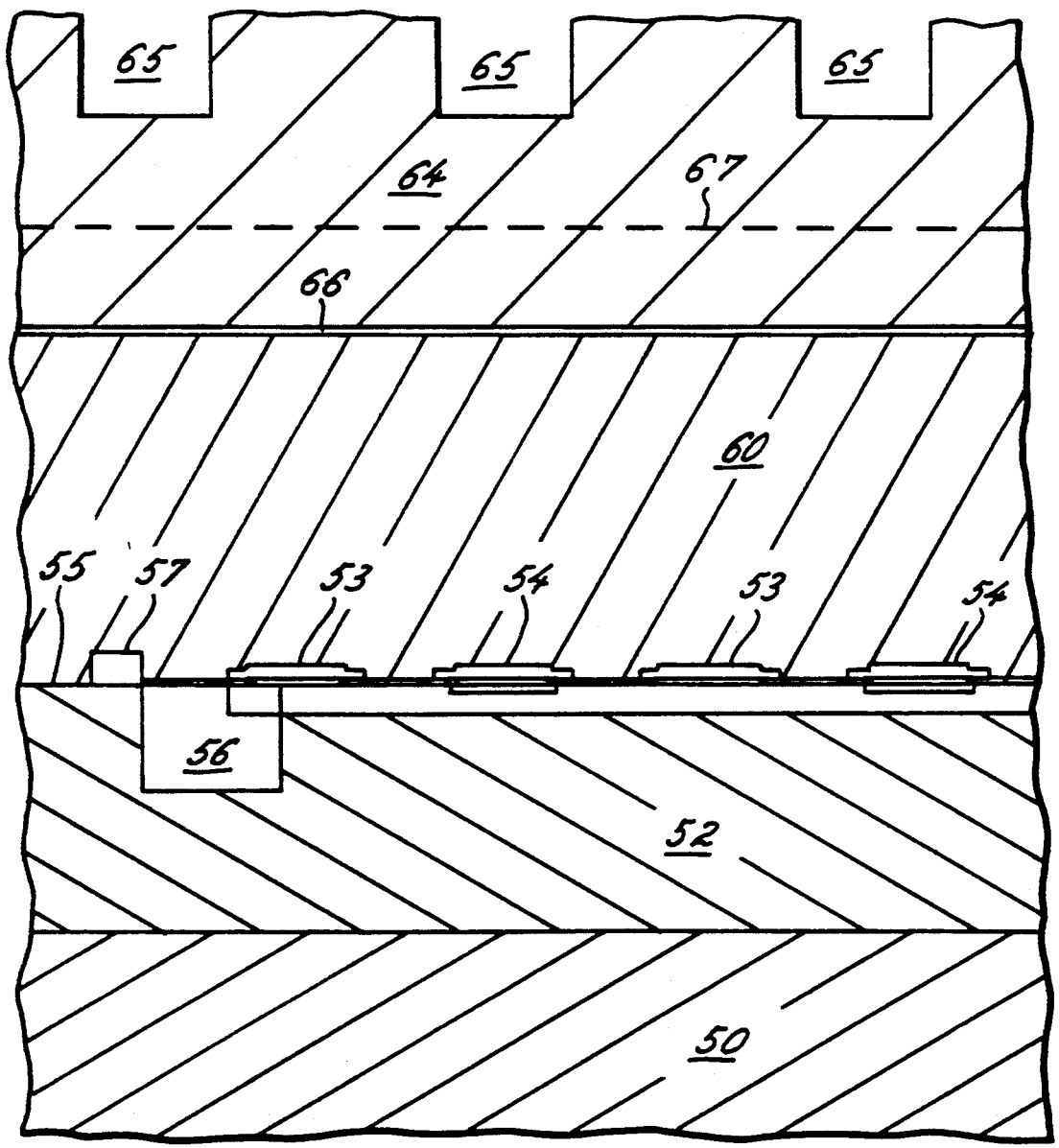
FIG. 4 is an enlarged partial elevational view better illustrating the relationship between the semiconductor and heat sink elements.

The relative thicknesses and the intimate relationship between the layers at the semiconductor heat sink interface are further illustrated in FIG. 4. A semi-insulating or semiconductive substrate is represented by silicon substrate 50, on which is grown an epitaxial layer 52. The epitaxial layer 52, as is well-known, contains carriers or dopants which form the active semiconductor regions of the device. Those regions are not illustrated in detail, but FIG. 4 does show metallization for base electrodes 53, emitter electrodes 54, and a semiconductor region for the collector 55. The diagram also demonstrates that the epitaxial layer can contain insulating guard regions 56 to create a barrier between the base-emitter and collector regions, and an insulating oxide 57 over the base-collector edge. The diagram is not intended to illustrate exact details of an electronic device, but it is intended to show salient features of an exemplary device which is high power in nature, more particularly a high power silicon bipolar power cell. It is seen that in practicing the invention a thin film AlN layer 60 is formed directly over the semiconductor device, and covers the metallization, the insulators, the guard band, and any other features which appear directly at the surface of the device. Since the current which is carried by the device is carried through the metallized contacts 53, 54 and the doped regions in the epitaxial layer 52, it will be appreciated that the primary source of heat in the illustrated structure is in the epitaxial layer which is typically only about 5 to 10 microns thick. The approximately 10 micron thick AlN layer 60 is deposited directly over the epitaxial layer and thus is in intimate contact with the very elements which generate the heat, and can therefore conduct the heat away from the epitaxial layer 52 assuming there is an adequate temperature differential across the AlN film.

That temperature differential is assured by the microchannel heat sink schematically illustrated at 64 having microchannels 65 carrying fluid flow in relatively close proximity with the AlN film 60. A thin interface film 66 assures bonding between the metallic heat sink 64 and the AlN film 60. The heat dissipator which also can serve the function of the interface layer is typically on the order of 1 micron or less thick. A dashed line 67 illustrates that the heat sink 64 is typically a two-layer device comprising a first evaporated metallic film of about 0.5 to 1 microns in thickness on which the metallic heat sink structure is electroplated to a substantially greater thickness the magnitude of which is determined by the requirements of the particular device.

Realizing that the silicon substrate 50 is often 25 mils thick, the efficiency of the device will be appreciated since the approximately 5 micron layer which generates the heat is in intimate contact with a thin 5 to 10 micron AlN layer which conveys the heat away from the heat generating layer. Directly in contact with the AlN layer is the microchannel heat sink, and the microchannels of that heat sink are a matter of microns away from the AlN film. Thus, the heat in the solid material need travel a distance of less than 20 microns to the microchannels through a low heat resistance material, and the microchannels have adequate surface area for transferring the heat from the highly heat conductive copper heat sink to the coolant for transport to a chilling device or the like. It will thus be seen that the junctions formed in or on the epitaxial layer 52 can be maintained at a tolerable temperature level even when the semiconductor device is dissipating substantial power, creating heat fluxes on the order of 1000 watts per square centimeter or more.

Figure 5:
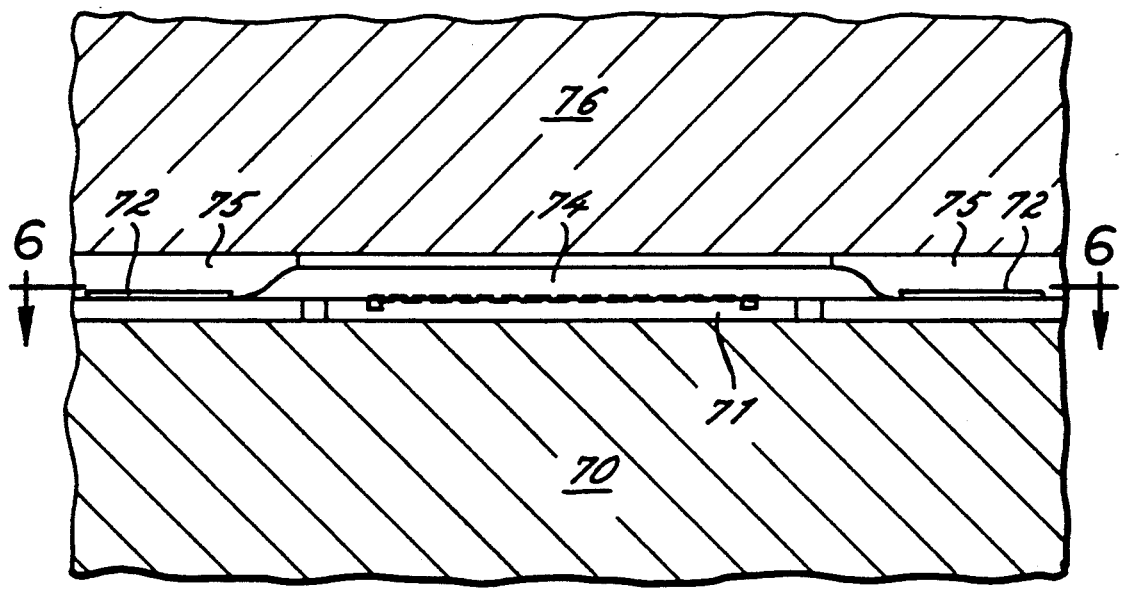
FIG. 5 is a view similar to FIG. 4 showing an alternative embodiment of the present invention for minimizing parasitic capacitance.
Figure 6:
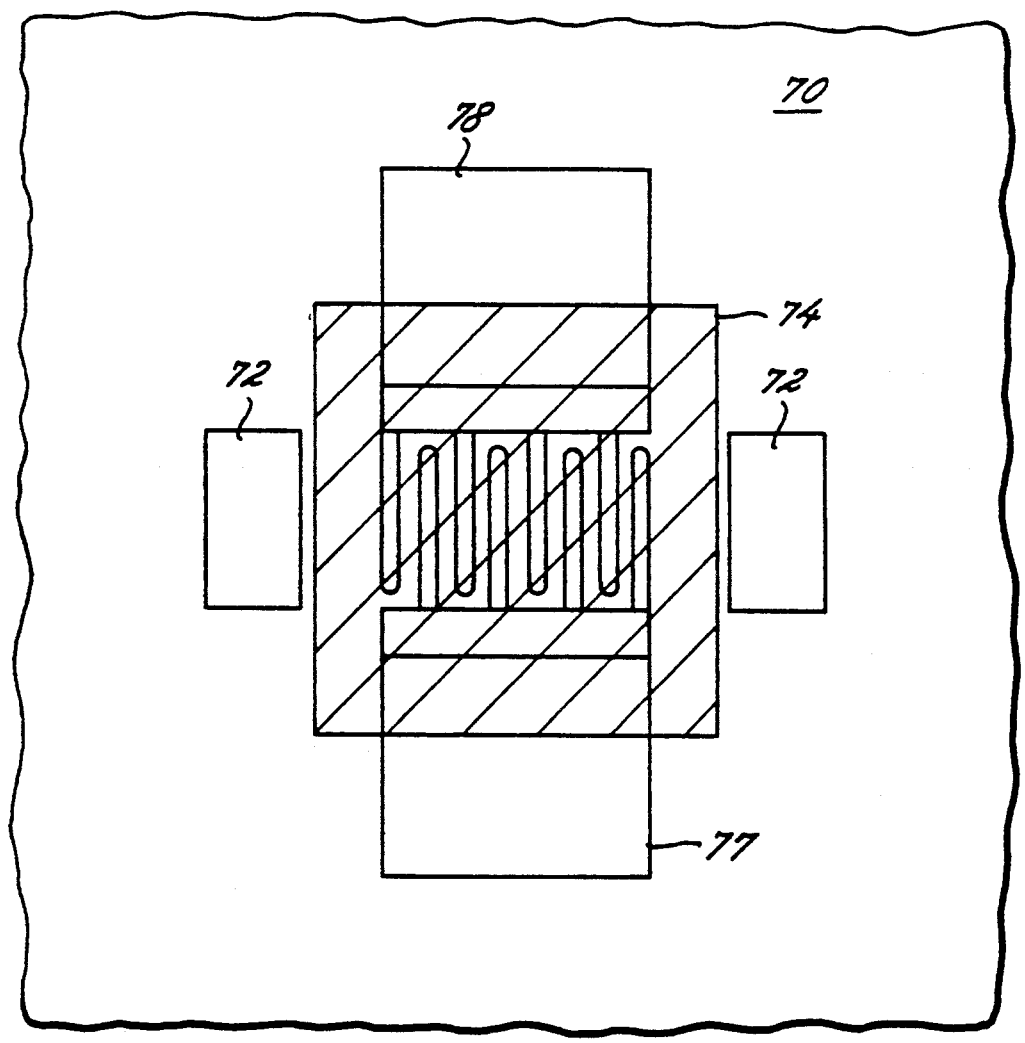
FIG. 6 is a plan view of the embodiment of FIG. 5.

It was noted above that the AlN film which conducts the heat immediately away from the semiconductor layer is a dielectric, and in some circumstances it is desirable to prevent contact between the dielectric layer and certain of the metallized contacts of the semiconductor device. For example, if the high power semiconductor device were a high frequency bipolar transistor, it would be highly undesirable to allow the AlN film to impose a substantial collector to ground (or collector to emitter) capacitance since that would substantially slow the switching speed of the device. To that end, means are provided for isolating selected contacts, such as the collector in the above-identified example, from the AlN film so that such selected contacts are isolated from parasitic capacitances resulting from the AlN film. FIGS. 5 and 6 illustrate the manner of achieving such selected isolation. FIG. 5 shows a substrate 70 having an epitaxial layer 71 formed thereon, the epitaxial layer carrying doped regions and the like to produce the desired semiconductor structure. Formed on top of or within the epitaxial layer 71 are structures such as metallization contacts and the like. FIG. 5 illustrates the collector contacts 72, near the periphery of the semiconductor device, such contacts intending to be free of the stray capacitance which might be introduced by the AlN film. FIG. 6 also shows an emitter contact 78 and base contact 77 both also positioned somewhat peripherally of the central doped portion of the epitaxial layer 71.

It is seen that an AlN film 74 is formed over a portion only of the epitaxial layer 71, leaving the collector electrodes 72 free of AlN material. In the FIG. 6 embodiment, portions of the emitter contact 78 and base contact 77 are also left free of the AlN film so that they are available for forming contacts such as wire bonds or the like prior to insulation and deposition of the microchannel heat sink. The heat conducting layer 74 can be formed by sputtering of a continuous layer, then patterning and etching away the unwanted portions. However, when AlN is used, it is preferable to sputter the material through a mask leaving free areas in the region 72, since AlN is difficult to etch by currently known techniques. In any event, the heat dissipating layer 74 such as of AlN is formed in the pattern illustrated in FIGS. 5 and 6, leaving the selected electrode 72 free of the thin film and thus free of the parasitic capacitance which that film might otherwise introduce. A low dielectric material 75 is then deposited over the collector electrode 72 and any other free regions, to form a substantially continuous upper surface for receiving the microchannel heat sink 76. While the structure of FIG. 5 is somewhat less efficient than that of FIG. 4 in conducting heat away from the semiconductor surface, since a portion of the semiconductor surface does not have a high heat transfer film formed thereon, it is preferable to the FIG. 4 embodiment in instances where selected electrodes or areas of the semiconductor device cannot tolerate the parasitic capacitance which might be introduced by the dielectric film.

It will now be appreciated that what has been provided is a simple and highly efficient heat sink device which is intimately associated with a high power semiconductor, allowing the semiconductor to operate with high dissipation while maintaining the junction temperature in the semiconductor at a tolerable level. A thin film of highly heat conductive material is formed directly on the semiconductor surface which generates the heat, and a highly efficient heat dissipating sink is formed on the heat conductive film, such that the conductive film conducts heat away from the semiconductor surface to the heat dissipator, and the heat dissipator transfers the heat to a flowing coolant fluid.

What is claimed is:

1. A high power semiconductor device with integral heat sink comprising, in combination:
   an integrated circuit having a substrate and an active semiconductor region formed on one surface of the substrate;
   an AlN monolithic thin film grown on the said one surface overlying the active semiconductor region, the AlN thin film having a sufficiently low impurity content to cause said thin film to function as a low thermal resistance heat conductor removing heat from the active semiconductor region with which said thin film is in contact; and
   a microchannel heat sink in thermal contact with the AlN thin film, the microchannel heat sink being supplied with a source of cooling fluid for conducting heat away from the microchannel heat sink.

2. The combination as set out in claim 1 further including a low thermal resistance interface for forming an intimate connection between the AlN thin film and the microchannel heat sink.

3. The combination a set forth in claim 1 wherein the microchannel heat sink comprises a plated metal heat sink having a plurality of microchannels formed therein, and means coupling the microchannels to the fluid source for carrying heat from said microchannel heat sink.

4. The combination as set forth in claim 3 wherein the microchannels have a width in the range between about 50 and 1000 microns.

5. The combination as set forth in claim 4 wherein the AlN thin film is on the order of 10 microns in thickness.

6. The combination as set forth in claim 2 wherein the microchannel heat sink comprises a plated metal heat sink having a plurality of microchannels formed therein, and means coupling the microchannels to the fluid source for carrying heat from said microchannel heat sink.

7. The combination as set forth in claim 6 wherein the microchannels have a width in the range between about 50 and 1000 microns.

8. The combination as set forth in claim 7 wherein the AlN thin film is on the order of 10 microns in thickness.

* * * * *